US010643942B2

(12) United States Patent
Pun et al.

(10) Patent No.: US 10,643,942 B2
(45) Date of Patent: May 5, 2020

(54) FORMATION OF FINE PITCH TRACES USING ULTRA-THIN PAA MODIFIED FULLY ADDITIVE PROCESS

(71) Applicant: Compass Technology Company Limited, Hong Kong (HK)

(72) Inventors: Kelvin Po Leung Pun, Hong Kong (HK); Chee Wah Cheung, Hong Kong (HK)

(73) Assignee: Compass Technology Company Limited, Shatin, New Territories (HK)

( * ) Notice: Subject to any disclaimer, the term of this patent is extended or adjusted under 35 U.S.C. 154(b) by 0 days.

(21) Appl. No.: 16/575,554

(22) Filed: Sep. 19, 2019

(65) Prior Publication Data

US 2020/0013700 A1    Jan. 9, 2020

Related U.S. Application Data

(62) Division of application No. 15/887,346, filed on Feb. 2, 2018, now Pat. No. 10,468,342.

(51) Int. Cl.
*H01L 23/498* (2006.01)
*H01L 21/48* (2006.01)
(Continued)

(52) U.S. Cl.
CPC ...... *H01L 23/4985* (2013.01); *C23C 18/1641* (2013.01); *C25D 3/38* (2013.01); *C25D 5/02* (2013.01); *H01L 21/481* (2013.01); *H01L 21/486* (2013.01); *H01L 21/4857* (2013.01); *H01L 23/49822* (2013.01);
(Continued)

(58) Field of Classification Search
CPC ............. H01L 23/4985; H01L 23/5387; H01L 23/49827; H01L 21/4857; H01L 21/481; H01L 21/486; H01L 23/49894; H01L 23/49822; H01L 24/86; H01L 2224/86203; H01L 2224/8683; H01L 23/5384;
(Continued)

(56) References Cited

U.S. PATENT DOCUMENTS

| 7,878,385 B2 | 2/2011 | Kumar et al. |
| 8,440,506 B2 | 5/2013 | Roberts et al. |
| 8,940,581 B2 | 1/2015 | Lee et al. |
| 8,967,452 B2 | 3/2015 | Cheung et al. |

(Continued)

OTHER PUBLICATIONS

PCT Search Report, International App No. PCT/CN2018/000272, Applicant: Compass Technology Company Limited, dated Oct. 25, 2018, 12 pages.

(Continued)

*Primary Examiner* — Caleen O Sullivan
(74) *Attorney, Agent, or Firm* — Saile Ackerman LLC; Stephen B. Ackerman; Rosemary L. S. Pike

(57) ABSTRACT

A method to produce a substrate suitable for diffusion bonding is described. A flexible dielectric substrate is provided. An alkaline modification is applied to the dielectric substrate to form a polyamic acid (PAA) anchoring layer on a surface of the dielectric substrate. A Ni—P seed layer is electrolessly plated on the PAA layer. Copper traces are plated within a photoresist pattern on the Ni—P seed layer. A surface finishing layer is electrolytically plated on the copper traces. The photoresist pattern and Ni—P seed layer not covered by the copper traces are removed to complete the substrate suitable for diffusion bonding.

25 Claims, 13 Drawing Sheets

(51) Int. Cl.
  *C25D 3/38* (2006.01)
  *C25D 5/02* (2006.01)
  *H01L 23/538* (2006.01)
  *C23C 18/16* (2006.01)
  *H01L 23/00* (2006.01)

(52) U.S. Cl.
  CPC .. *H01L 23/49827* (2013.01); *H01L 23/49894* (2013.01); *H01L 23/5387* (2013.01); *H01L 23/5383* (2013.01); *H01L 23/5384* (2013.01); *H01L 24/86* (2013.01); *H01L 2224/8683* (2013.01); *H01L 2224/86203* (2013.01)

(58) Field of Classification Search
  CPC ......... H01L 23/5383; C25D 5/02; C25D 3/38; C23C 18/1641
  USPC ....................................................... 257/762
  See application file for complete search history.

(56) References Cited

U.S. PATENT DOCUMENTS

| | | | |
|---|---|---|---|
| 9,089,062 B2 | 7/2015 | Janssen | |
| 9,153,551 B2 | 10/2015 | Liang | |
| 9,324,733 B2 | 4/2016 | Rogers et al. | |
| 10,468,342 B2 * | 11/2019 | Pun | C23C 18/1689 |
| 2012/0037405 A1 | 2/2012 | Hamazawa et al. | |
| 2014/0224527 A1 | 8/2014 | Chiu et al. | |
| 2015/0136209 A1 | 5/2015 | Hattori et al. | |

OTHER PUBLICATIONS

"Latest advancement of fully additive process for 8 µm ultra-fine pitch chip-on-film (COF) aby nano-size Ni-P metallization," by Kelvin P. L. Pun et al., Journal of Materials Science: Materials in Electronics, vol. 29, Issue No. 8, Jan. 31, 2018, pp. 6937-6949.

* cited by examiner

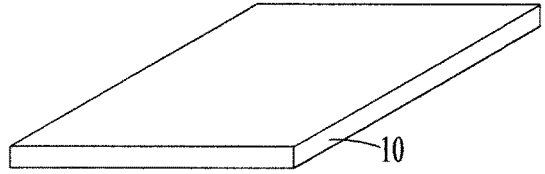
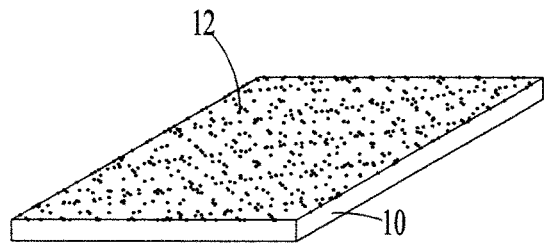
Figure 2A
Figure 2B
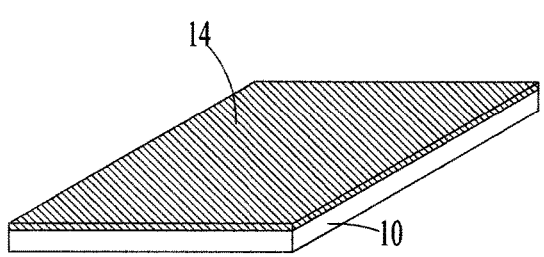
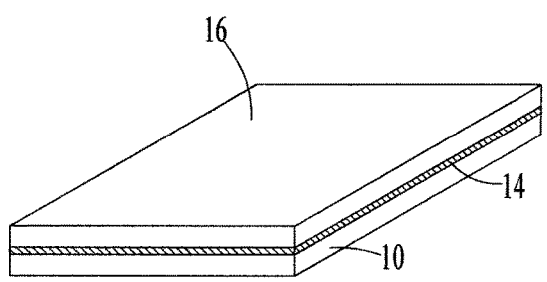
Figure 2C
Figure 2D
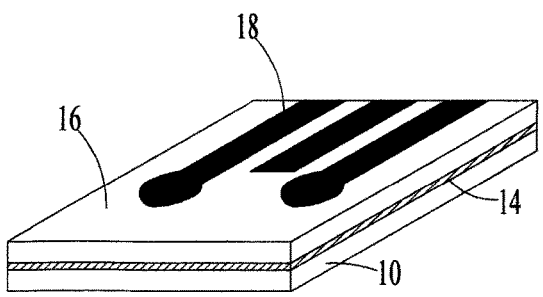
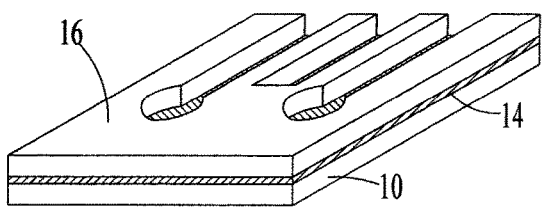
Figure 2E
Figure 2F

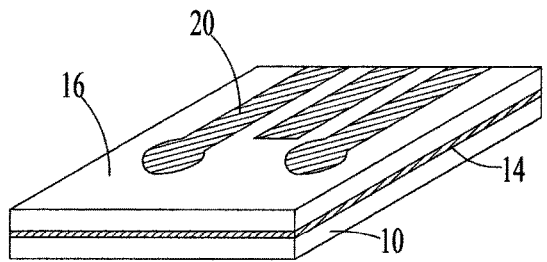
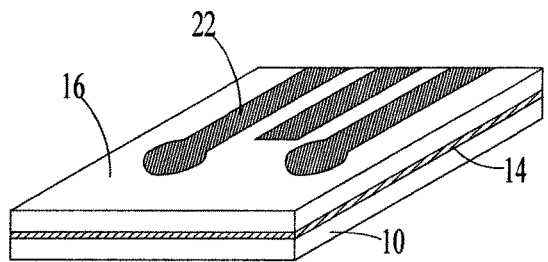
Figure 2G
Figure 2H
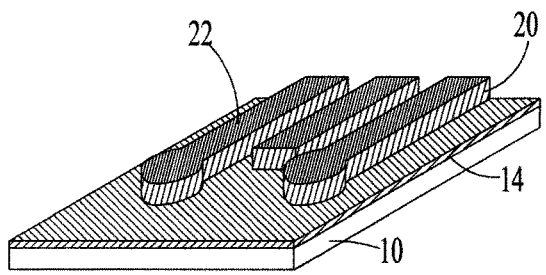
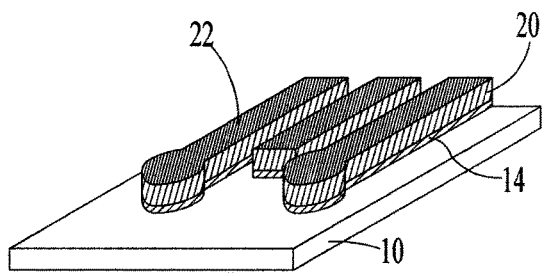
Figure 2I
Figure 2J
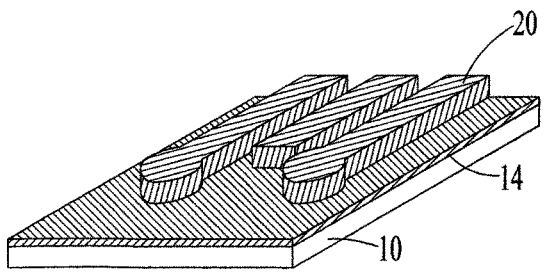
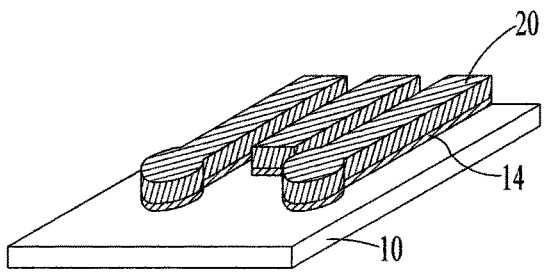
Figure 2K
Figure 2L

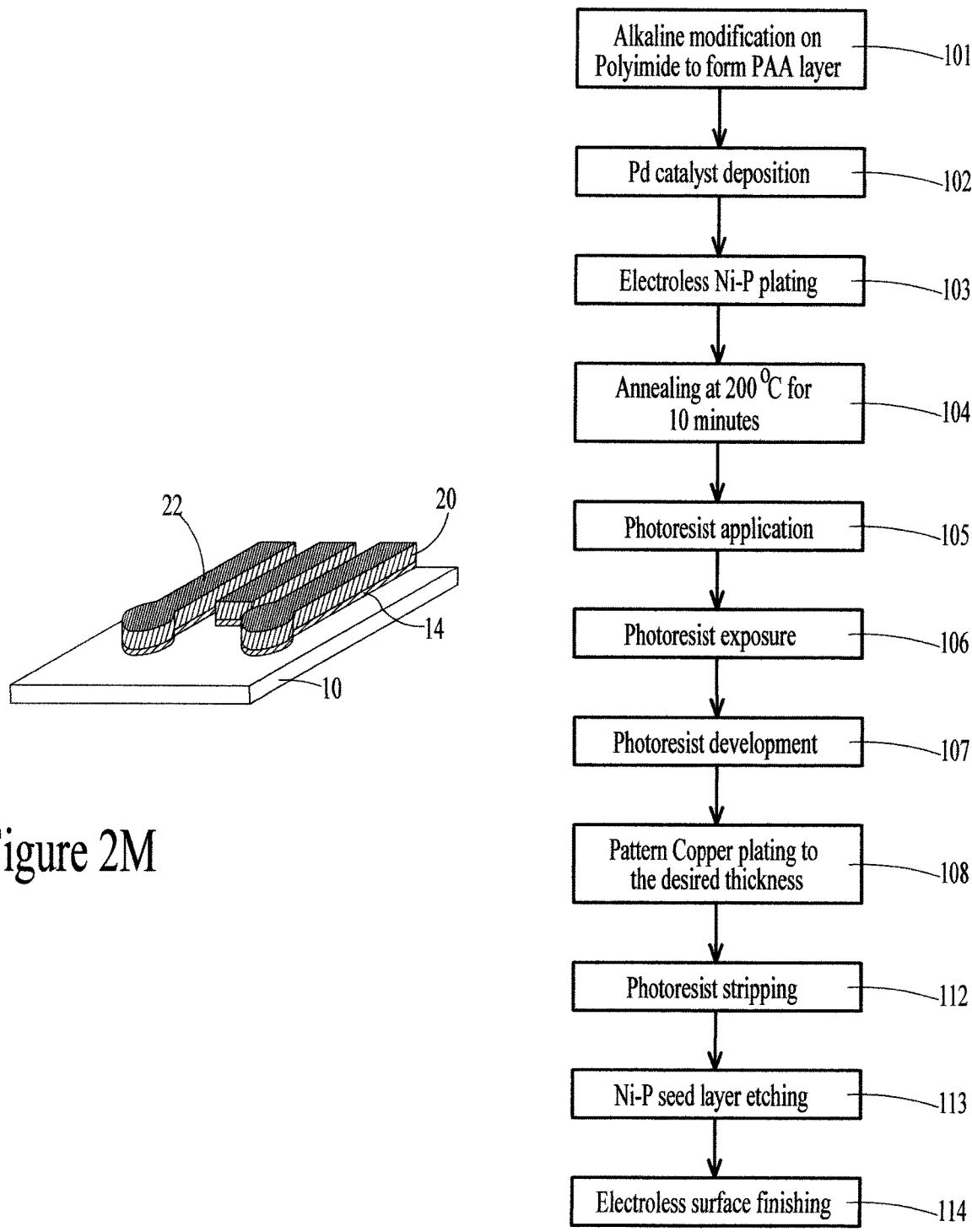

FORMATION OF FINE PITCH TRACES USING ULTRA-THIN PAA MODIFIED FULLY ADDITIVE PROCESS

This application is a divisional application of Ser. No. 15/887,346, filed on Feb. 2, 2018, owned by a common assignee and herein incorporated by reference in its entirety.

TECHNICAL FIELD

This application relates to producing a flexible substrate with fine copper traces, and more particularly, to producing a semiconductor package with solid state diffusion bonding using a flexible substrate with fine copper traces.

BACKGROUND

The demand for smaller and low-cost electronics has given rise to new development of fine line and high yield processes in substrate technology. Chip-on-film (COF) packaging constitutes a substantial technology to cope with the future demands of higher function, lower power consumption and miniaturization; in particular, high resolution and increasing I/O count of touch integrated circuit (IC) and display-drive IC integrated modules (TDDI) requiring extremely fine pitch COF packages. Conventionally, a flexible circuit is fabricated in a subtractive method where the copper trace pattern is formed by etching. However, this subtractive method has an inherent problem in sidewall geometry control. In a conventional semi-additive process (SAP), usually 2-3 µm thick Cu with Ni/Cr as a seed layer are used. During the removal of these layers, the wet etching process that is isotropic and not well-controlled causes simultaneous etching of both copper and the seed layer. This creates a major process limitation "undercutting," which in turn creates several challenges for fine-line and precision patterning and leads to failure of weakened fine traces.

During diffusion bonding of the flip chip assembly, a number of independent aspects require consideration. The deformable layer must provide the requisite electrical properties with good trace integrity. It must be able to withstand sufficient pressure during contact and hence there must be enough top width on the trace so that a full contact interface with proper creep deformation and void elimination on the bonding zone is achieved. As the bond pitch reduces, the semi-additive and subtractive methods have limitations to maintain the top to bottom width (T/B) ratio as close to 1 while achieving a reasonable yield.

An alternative method is a full additive process (FAP), in which the copper pattern can be formed by electroless plating. Prior to electrochemical deposition, a thin seed layer of electroless Ni—P is formed on the polyimide (PI) that has undergone alkaline surface modification. The PI which is comprised of an imide ring can be easily opened by the incoming nucleophilic hydroxide ion forming polyamic acid salt (PAA). Since the carboxylate group on this polyamic acid is an ion exchange group, it can be reduced to deposit a Pd catalyst when treated in an aqueous Pd (II) ion solution. Once the catalyst is deposited, subsequent electroless plating is then possible. However, such a method suffers from peel strength degradation of the PI film after heat treatment and therefore is not reliable for practical applications.

U.S. Pat. No. 9,089,062 (Janssen) and U.S. Pat. No. 9,324,733 (Rogers et al) disclose methods involving polyamic acid and alkaline plating baths.

SUMMARY

A principal object of the present disclosure is to provide a method of producing a plurality of fine traces on a flexible substrate for a chip on flex (COF) package.

Another object of the disclosure is to provide a fully additive method of plating up fine and robust copper traces on a flexible substrate for a chip on flex (COF) package.

A further object of the disclosure is to provide a fully additive method of plating up fine and robust copper traces on a flexible substrate for a chip on flex (COF) package using electroless Ni—P and a reliable nano-size polyamic acid (PAA) anchoring layer on the dielectric/Ni—P interface.

According to the objects of the disclosure, a method to produce a substrate suitable for various interconnection methods including thermocompression bonding, wire bonding, adhesive bonding, and soldering is achieved. A flexible dielectric substrate is provided. An alkaline modification is applied to the dielectric substrate to form a polyamic acid (PAA) anchoring layer on a surface of the dielectric substrate. A Ni—P seed layer is elecrolessly plated on the PAA layer. Copper traces are plated within a photoresist pattern on the Ni—P seed layer. A surface finishing layer is electrolytically plated on the copper traces. The photoresist pattern and Ni—P seed layer not covered by the copper traces are removed to complete the substrate suitable for diffusion bonding.

Also according to the objects of the disclosure, a method of manufacturing a 2ML (metal layer) substrate suitable for various interconnection methods including thermocompression bonding, wire bonding, adhesive bonding, and soldering is achieved. A flexible dielectric substrate is provided. At least one via opening is laser drilled all the way through the dielectric substrate. An alkaline modification is applied to the dielectric substrate to form a polyamic acid (PAA) anchoring layer on top and bottom surfaces of the dielectric substrate. A Ni—P seed layer is electrolessly plated on top and bottom PAA layers. Photoresist (dry resist/wet resist) is applied, exposed, and developed to form the circuit pattern. Copper traces are plated within photoresist patterns on the top and bottom Ni—P seed layers and through the at least one via opening. A surface finishing layer is electrolytically plated at least on one side of the copper traces. The photoresist patterns and Ni—P seed layers not covered by the copper traces are removed to complete the substrate suitable for diffusion bonding.

Also according to the objects of the disclosure, a method of manufacturing a multiplayer substrate suitable for various interconnection methods including thermocompression bonding, wire bonding, adhesive bonding, and soldering is achieved. A flexible dielectric substrate is provided. At least one via opening is laser drilled all the way through the dielectric substrate. An alkaline modification is applied to the dielectric substrate to form a polyamic acid (PAA) anchoring layer on top and bottom surfaces of the dielectric substrate. A Ni—P seed layer is electrolessly plated on top and bottom PAA layers. Photoresist (dry resist/wet resist) is applied, exposed, and developed to form the circuit pattern. Copper traces are plated within photoresist patterns on the top and bottom Ni—P seed layers and through the at least one via opening. The photoresist patterns and Ni—P seed layers not covered by the copper traces are removed to complete the substrate suitable for diffusion bonding. Thereafter, a bonding film is laminated on top and bottom surfaces of the first copper traces. A dielectric layer (PI) is laminated on top and bottom of the bonding films. At least one second via opening is laser drilled all the way through the dielectric layer and bonding film to contact the first copper traces on top and bottom of the substrate. Thereafter an alkaline modification is applied to the dielectric layers to form a second polyamic acid (PAA) anchoring layer on top and bottom surfaces of the dielectric layers and within the at least one second via openings. A second Ni—P seed layer is electrolessly plated on top and bottom of the second PAA layers. A second photoresist pattern is formed on top and bottom of the second Ni—P seed layers. Second copper traces are plated within the second photoresist patterns and through the at least one second via opening. A surface finishing layer is plated on the second copper traces. The second photoresist patterns are removed and the second Ni—P seed layers not covered by the second copper traces are etched away to complete the flexible substrate.

Also according to the objects of the disclosure, a 2ML (metal layer) chip on film (COF) is achieved. The COF comprises a flexible dielectric substrate having a first polyamic acid (PAA) anchoring layer on its top surface, at least one first copper trace on a first Ni—P seed layer on the first PAA layer and having a surface finishing layer on a top surface of the at least one first copper trace, and at least one die mounted on the dielectric substrate through diffusion bonding with the at least one first copper trace.

Also according to the objects of the disclosure, a multilayer chip on film (COF) is achieved. The COF comprises a flexible dielectric substrate having a first polyamic acid (PAA) anchoring layer on its top surface and a second PAA layer on its bottom surface, at least one first copper trace on a first Ni—P seed layer on the first PAA layer and at least one second copper trace on a second Ni—P seed layer on the second PAA layer wherein the first and second copper traces are interconnected through a via through the dielectric substrate, having a surface finishing layer on a top surface of the at least one first copper trace, and at least one die mounted on the dielectric substrate through diffusion bonding with the at least one first copper trace.

BRIEF DESCRIPTION OF THE DRAWINGS

In the accompanying drawings forming a material part of this description, there is shown:

FIGS. 2A-2G schematically illustrate in oblique representation steps in a first alternative of the first preferred embodiment of the present disclosure.

FIGS. 2H-2J schematically illustrate in oblique representation additional steps in a first alternative of the first preferred embodiment of the present disclosure.

FIG. 3 is a flowchart of steps in a second alternative of the first preferred embodiment of the present disclosure.

FIGS. 2K-2M schematically illustrate in oblique representation additional steps in the second alternative of the first preferred embodiment of the present disclosure.

DESCRIPTION OF THE PREFERRED EMBODIMENTS

Figure 1:
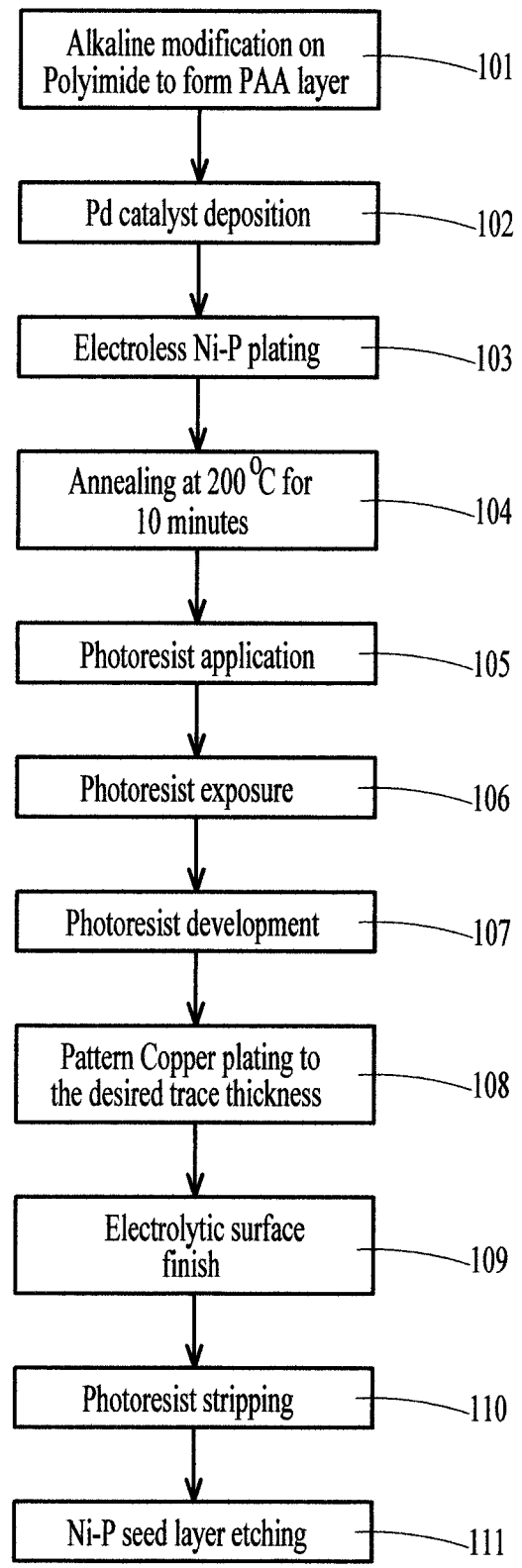
FIG. 1 is a flowchart of steps in a first alternative of a first preferred embodiment of the present disclosure.

With the emerging trend of increasing I/O and decreasing device size with more functions and higher speeds, demand for substrate technology is more challenging than ever. As the circuit pitch reduces, conventional subtractive and semi-additive processes are no longer able to produce fine traces below 20 μm with reasonable yield while maintaining a trace top to bottom width ratio of 1. Formation of robust fine traces is essential for high density interconnection to cope with future demands in display drivers, medical devices, smart wearables, Internet of Things (IoT), etc.

The present disclosure discloses a method of producing a plurality of fine traces on a flexible substrate, specifically for chip on flex (COF) packages. This process will plate up reliable and robust copper traces with a trace pitch as fine as 8 μm and top to bottom width ratio close to 1. The copper traces are built up by a fully additive process using electroless Ni—P as a seed layer on a modified dielectric material with a specific thickness that is capable of producing a reliable nano-size polyamic acid (PAA) anchoring layer on the dielectric/Ni—P interface. With the proposed fabrication process, the copper traces are able to maintain reliable interfacial adhesion despite having a smooth surface which is beneficial for signal transmission in the circuit. In terms of process capability, the proposed process is compatible with a wide range of dielectric and surface finishing materials. For assembly capability, the traces formed are suitable for various interconnection methods including thermocompression bonding, wire bonding, adhesive bonding, and soldering of IC/chip to form a semiconductor package. This formation of fine pitch COF is targeted for future demand of miniaturization in numerous sectors including organic light emitting diodes (OLED), active matrix organic light emitting diode (AMOLED), liquid crystal display thin film transistor (LCD/TFT), smart wearable, medical imaging, and IoTs packaging.

In the present disclosure, a fine pitch chip on flex (COF) is formed using a full additive process which is able to form reliable adhesion that ensures robust precision formation of fine traces on the flexible substrate and provides unique opportunities for ultra-fine pitch and high electrical performance interconnects.

Three preferred embodiments of the disclosed process will be described, the first using one metal layer flexible substrate, the second using a two metal layer flexible substrate, and the third using more than two stack-up conductive metal layers. Additionally, each embodiment may include either electrolytic surface finishing or electroless surface finishing.

Referring now to the flowchart in FIG. 1 and FIGS. 2A-2J, a first preferred embodiment in the process of the present disclosure will be described in detail. The process begins with a flexible dielectric substrate 10. The dielectric may be any kind of polyimide (PI), such as Kapton PI or Upisel PI, or liquid crystal polymer (LCP). Dielectric 10 has a preferred thickness of between about 12.5 and 100 µm, as shown in FIG. 2A.

Now, in step 101 of FIG. 1, the polyimide surface is modified by applying a KOH/alkaline base chemical to the PI surface. This alters the molecular bond forming a polyamic acid (PAA) layer 12, as shown in FIG. 2B. Concentration of the modifier chemical is optimized to produce a PAA layer thickness of less than 10 nm in order to achieve the desirable trace integrity performance. The modification layer of the present disclosure is extremely thin (<10 nm), which can prevent the degradation of chemical bonding by reducing water intake on the layer during heat treatment and consequently minimizing the effect induced by the coefficient of hygroscopic expansion. Therefore, high adhesion can still be maintained after heat treatment. In some cases where heat treatment is not a concern, the PAA layer could be more than 10 nm, but should be less than 100 nm. The ultra-thin PAA layer (thickness preferably <10 nm) contains carboxyl and amide bonding, which corresponds to O=C—NH (amide) and O=C—OH (carboxyl), that are responsible for enhancement of interfacial adhesion between the polyimide and an overlying Ni—P layer.

Next, in step 102, a catalyst layer, not shown, is deposited on the PAA layer by immersion into an ionic metal solution. Typically, Palladium (Pd) or Nickel (Ni) is deposited to activate the surface for subsequent electroless Ni—P plating. In step 103 and FIG. 2C, an autocatalytic nickel-phosphorus (Ni—P) seed layer 14 is applied over the modified polyimide film using an electroless plating process. The thickness of the Ni—P layer is ideally 0.1 µm+/−10%. The composition of Ni—P in the seed layer is Ni: 96.5~97.5 wt %, P: 2.5~3.5 wt %.

In step 104, the substrate is annealed at about 200° C. for a duration of at least ten minutes to at most two hours. In step 105, as shown in FIG. 2D, a layer of photoresist 16, preferably a positive-acting photoresist, is applied to the seed layer surface of the substrate. The photoresist may be a dry film or a liquid photoresist. In the photolithography process, the photoresist is exposed (step 106 and FIG. 2E) and developed (step 107 and FIG. 2F) to form a fine pitch trace for circuitization.

In step 108 and FIG. 2G, a layer of conductive metal 20, including a plurality of traces for active bonding and a soldering pad, is plated up to the desired thickness using electrolytic copper plating. The plating is employed only on the areas of the spacing which are not covered by the photoresist. In some applications, the plating is controlled to be at an aspect ratio of close to 1. The ratio of the top to bottom widths of the traces using this method can be close to 1. The copper is a fine-grained deposit with highly ductile properties. The thickness of copper is about 8 µm. In some applications, the thickness of electrolytic copper can be in a range of 2-18 µm. The elongation strength of the copper deposit is over 15% with a tensile strength of between 290-340 N/mm². The hardness of electrolytic copper is 100 in vicker hardness with a purity of more than 99.9%. The electrolytic copper plating process enables high speed plating that enables mass production of the fine pitch COF.

In step 109, the surfaces of the traces are finished by plating electrolytic Ni/Au, electrolytic Palladium, electrolytic Titanium, electrolytic Tin, or electrolytic Rhodium as shown by 22 in FIG. 2H.

The photoresist layer 16 is stripped, as shown in step 110 and FIG. 2I, followed by etching away the Ni—P seed layer 14 using a hydrogen peroxide acidic base solution that is strictly controlled to etch the Ni—P seed layer in a unidirectional manner with no or minimal etch on the copper trace to maintain the copper trace aspect ratio of close to 1, as shown in step 111 and FIG. 2J. This completes formation of the traces on the flexible substrate.

The inner lead bonding (ILB) pitch between the traces is a pitch defining a center to center distance between two adjacent traces, each respective trace having a respective surface layer. The ILB of the substrate of the present disclosure is less than about 8 µm. In some applications, the ILB pitch can be 4-30 µm.

After completing the formation of traces on the flexible substrate, the COF is assembled. The traces are compatible with various interconnection methods including thermocompression bonding, adhesive bonding, wire bonding and soldering of die or dies to form the semiconductor package.

Figure 13:
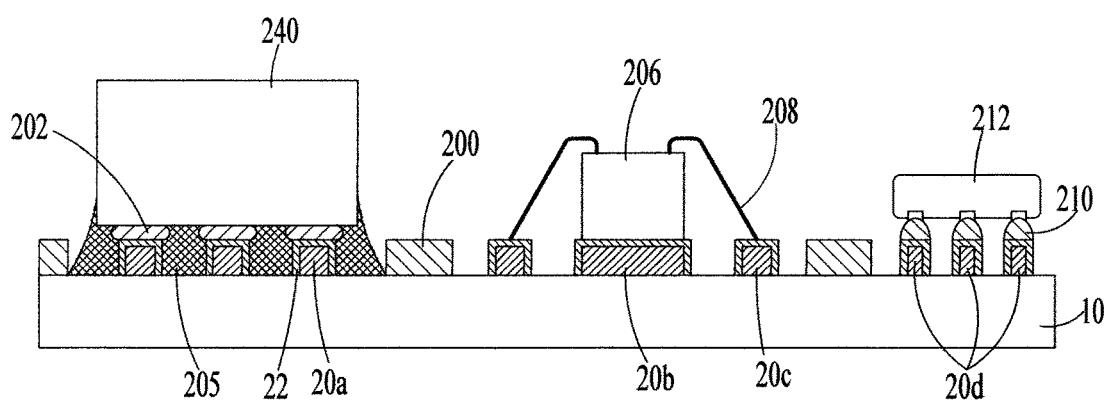
FIG. 13 is an oblique representation of a completed COF using the flexible substrate of the present disclosure.

For example, FIG. 13 shows a completed COF using the flexible substrate of the present disclosure. Copper traces 20 with surface finishing 22 on substrate 10 with PAA surface treatment are used to connect with several components. Die 204 is shown with thermocompressive bonding to copper traces 20a through gold bumps 202. Solder mask 200 and underfill 205 is shown. Die 206 is bonded to a copper trace 20b preferably using epoxy. Gold wires 208 are bonded to copper traces 20c. Component 212 is soldered (210) to copper traces 20d.

A second alternative in the first embodiment of the disclosure will now be described with reference to the flowchart in FIG. 3 and FIGS. 2A-2G and 2K-2M. The first alternative process included an electrolytic surface finishing. The second alternative process includes an electroless surface finishing. FIG. 3 shows that the steps in the process of the second alternative are identical to the first alternative through step 108, copper plating, as shown in FIG. 2G.

Now, in the second alternative, in step 112, photoresist 16 is stripped from the substrate, leaving copper traces 20 on the Ni—P layer 14, as shown in FIG. 2K. Next, in step 113, the Ni—P layer is etched away from the substrate, as shown in FIG. 2L.

Finally, in step 114, the surfaces of the traces are finished by selective surface finishing by electroless plating of Ni/Au, electroless Nickel/Immersion gold (ENIG), Electroless Nickel/Electroless Palladium/Immersion Gold (ENEPIG), Electroless Palladium/Autocatalytic Gold (EPAG), or Immersion Gold/Electroless Palladium/Immersion Gold (IGEPIG), as shown by 22 in FIG. 2M.

The electroless process of the second alternative requires a thinner surface finishing thickness but has a slower plating rate as compared to electrolytic plating.

The first embodiment shows a method of manufacturing a flexible substrate having at least one metal layer. The metal layer can be one conductive metal layer or more than one conductive metal layer. Additionally, the flexible substrate can have double sided conductive metal layers or more than two stack-up conductive metal layers.

The second embodiment of the present disclosure shows a double sided (2 ML) metal layer process. Referring now to the flowchart in FIG. 4 and FIGS. 5A-5H, the second preferred embodiment in the process of the present disclosure will be described in detail. The process begins with a flexible dielectric substrate 10. The dielectric may be any kind of polyimide (PI), such as Kapton PI or Upisel PI, or liquid crystal polymer (LCP), Dielectric 10 has a preferred thickness of between about 12.5 and 100 µm, as shown in FIG. 5A.

Figure 4:
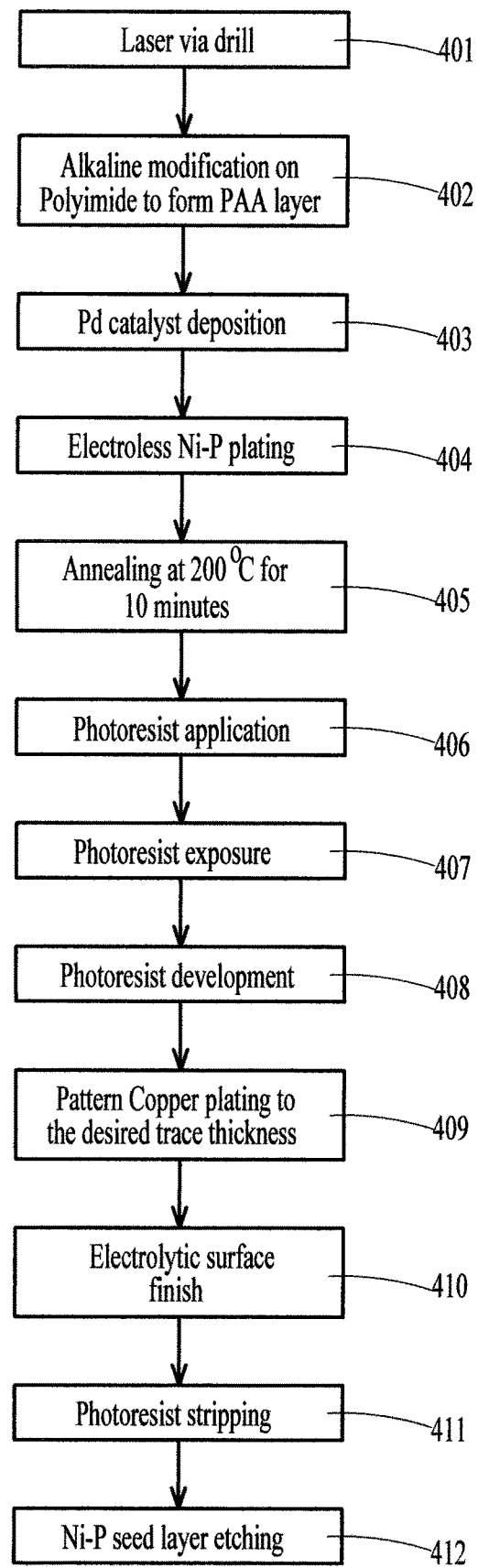
FIG. 4 is a flowchart of steps in a first alternative of a second preferred embodiment of the present disclosure.
Figure 5A:
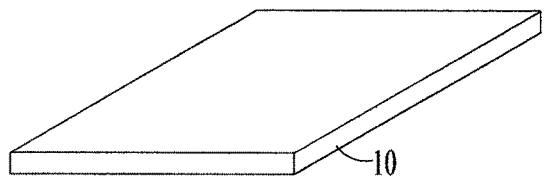
FIGS. 5A-5H schematically illustrate in oblique representation steps in the second preferred embodiment of the present disclosure.
Figure 5B:
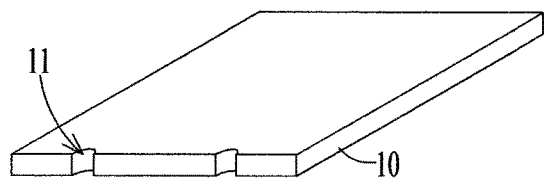
Figure 5C:
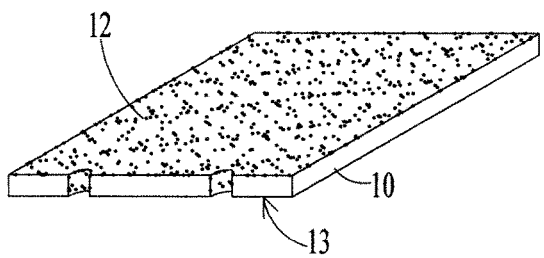
Figure 5D:
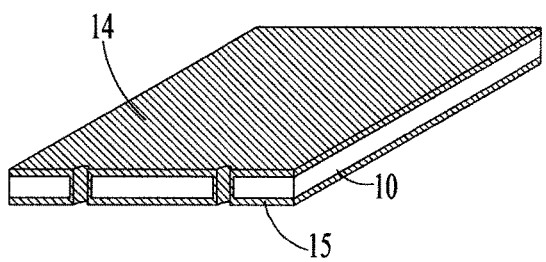

Now, in step 401 of FIG. 4, via openings 11 are laser drilled through the substrate 10, as shown in FIG. 5B. Vias will electrically connect the metal layer on either side of the substrate. In step 402, the polyimide surface is modified by applying a KOH/alkaline base chemical to the PI surface. This alters the molecular bond forming a polyamic acid (PAA) layer 12 on the top side of the substrate and 13 on the bottom side of the substrate, as shown in FIG. 5C, as well as within the via openings. Concentration of the modifier chemical is optimized to produce a PAA layer thickness of less than 10 nm in order to achieve the desirable trace integrity performance. In some cases, the PAA layer could be more than 10 nm, but should be less than 100 nm. The ultra-thin PAA layer (preferably having a thickness <10 nm) contains carboxyl and amide bonding, which corresponds to O=C—NH (amide) and O=C—OH (carboxyl), that are responsible for enhancement of interfacial adhesion between the polyimide and overlying Ni—P layer.

Next, in step 403, catalyst layers, not shown, are deposited on the PAA layers 12 and 13 by immersion into an ionic metal solution. Typically, Palladium (Pd) or Nickel (Ni) is deposited to activate the surface for subsequent electroless Ni—P plating. In step 404 and FIG. 5D, an autocatalytic nickel-phosphorus (Ni—P) seed layer 14,15 is applied over both sides of the modified polyimide film and within the via holes 11 using an electroless plating process. The thickness of the Ni—P layer is ideally 0.1 m+/−10%. The composition of Ni—P in the seed layer is Ni: 96.5~97.5 wt %, P: 2.5~3.5 wt %.

Figure 5E:
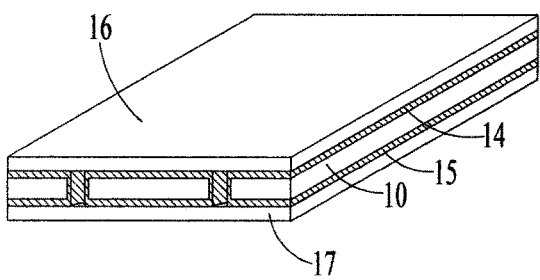
Figure 5F:
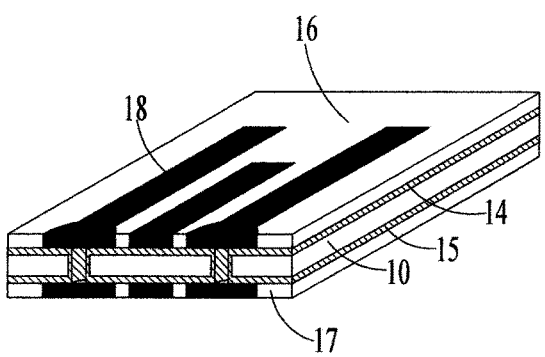
Figure 5G:
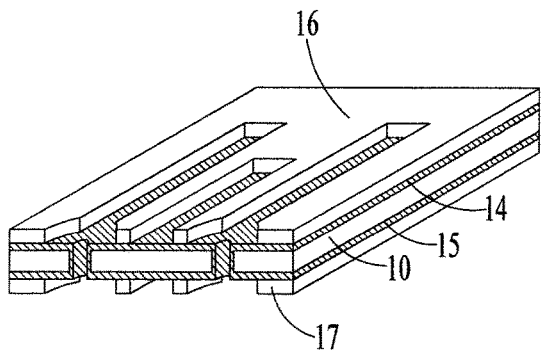

In step 405, the substrate is annealed at about 200° C. for at least ten minutes and at most two hours. In step 406, as shown in FIG. 5E, a layer of photoresist 16, 17, preferably a positive-acting photoresist, is applied to the top and bottom seed layer surfaces of the substrate, respectively. The photoresist may be a dry film or a liquid photoresist. In the photolithography process, the photoresist is exposed (step 407 and FIG. 5F) and developed (step 408 and FIG. 5G) to form a fine pitch trace for circuitization.

Figure 5H:
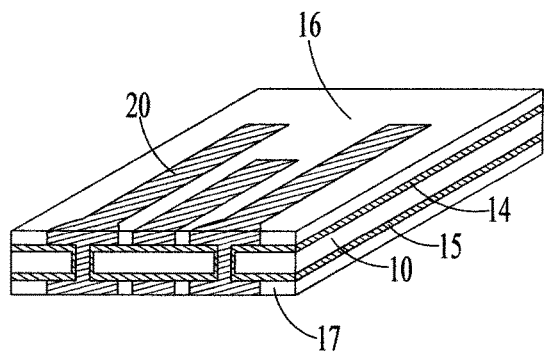

In step 409 and FIG. 5H, layers of conductive metal 20, 21, including a plurality of traces for active bonding and a soldering pad, are plated up to the desired thickness on top and bottom of the substrate, respectively, using electrolytic copper plating. The plating is employed only on the areas of the spacing which are not covered by the photoresist. In some applications, the plating is controlled to be at an aspect ratio of close to 1. The ratio of the top to bottom widths of the traces using this method can be close to 1. Plating continues through the via openings resulting in an electrical connection between the top and bottom copper layers. The copper is a fine-grained deposit with highly ductile properties. The thickness of copper is about 8 µm. In some applications, the thickness of electrolytic copper can be in a range of 2-18 µm. The elongation strength of the copper deposit is over 15% with a tensile strength of between 290-340 N/mm$^2$. The hardness of electrolytic copper is 100 in vicker hardness with a purity of more than 99.9%.

Figure 5I:
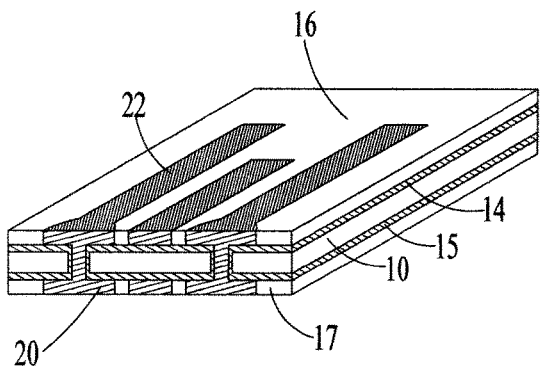
FIGS. 5I-5K schematically illustrate in oblique representation additional steps in the first alternative of the second preferred embodiment of the present disclosure.

In step 410, the surfaces of the traces 20 are finished by plating electrolytic Ni/Au, electrolytic Palladium, electrolytic Titanium, electrolytic Tin, or Electrolytic Rhodium, as shown by 22 in FIG. 5I. At least one of the traces on the top and the traces on the bottom of the substrate are finished with the surface finishing 22.

Figure 5J:
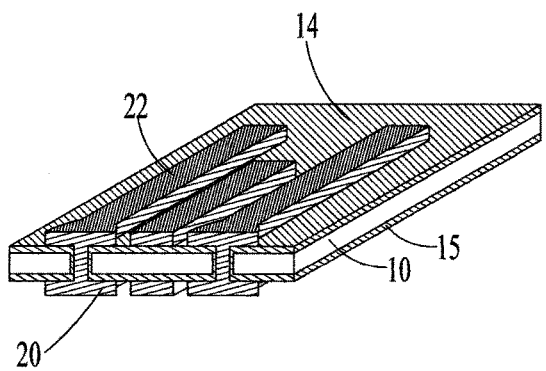
Figure 5K:
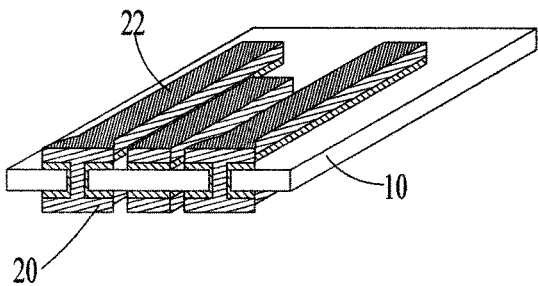

The photoresist layers 16,17 are stripped, as shown in step 411 and FIG. 5J, followed by etching away the Ni—P seed layer 14, 15 using a hydrogen peroxide acidic base solution that is strictly controlled to etch the Ni—P seed layer in unidirectional manner with no or minimal etch on the copper trace to maintain the copper trace aspect ratio of close to 1, as shown in step 412 and FIG. 5K. This completes formation of the traces on the flexible substrate.

A second alternative in the second embodiment of the disclosure will now be described with reference to the flowchart in FIG. 6 and FIGS. 5A-5H and 5L-5N. The first alternative process included an electrolytic surface finishing. The second alternative process includes an electroless surface finishing. FIG. 6 shows that the steps in the process of the second alternative are identical to the first alternative through step 409, copper plating, as shown in FIG. 5H.

Figure 5L:
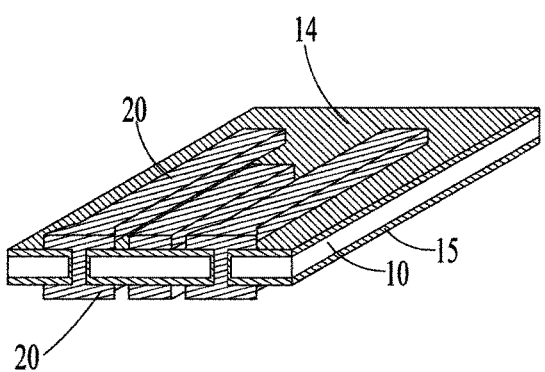
FIGS. 5L-5N schematically illustrate in oblique representation additional steps in the second alternative of the second preferred embodiment of the present disclosure.
Figure 5M:
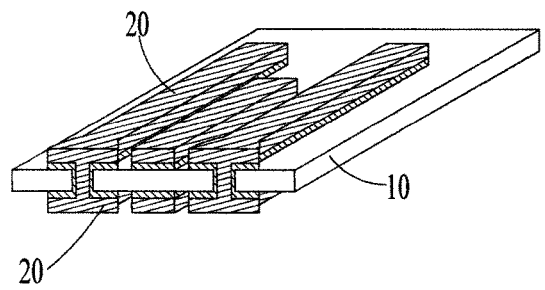
Figure 6:
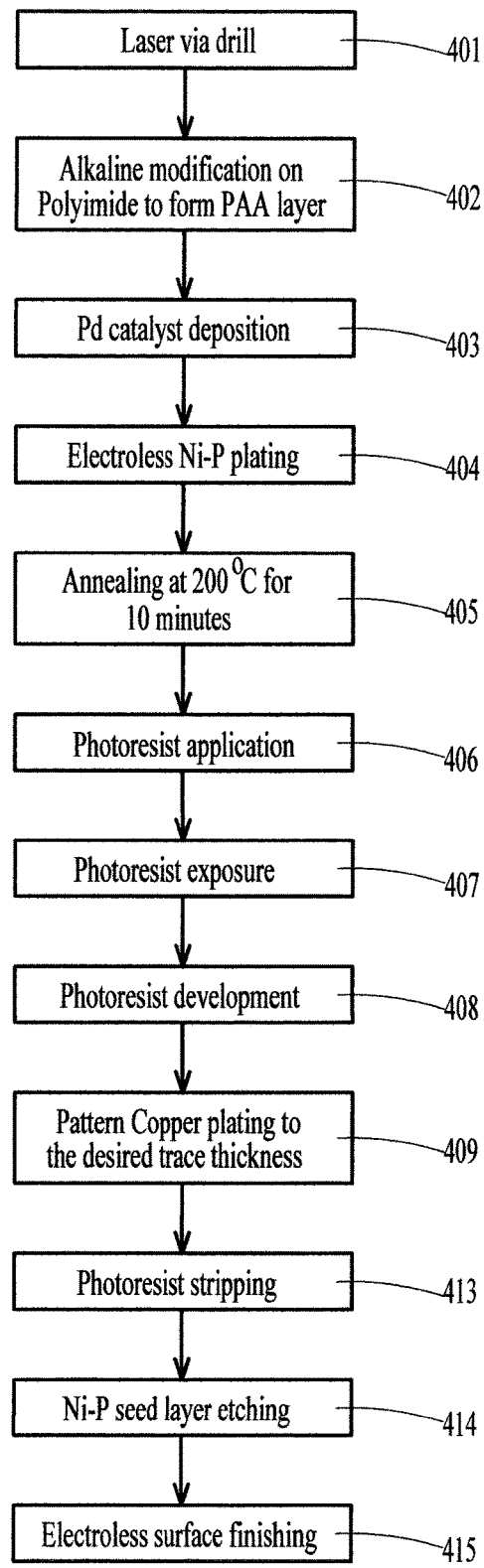
FIG. 6 is a flowchart of steps in a second alternative of the second preferred embodiment of the present disclosure.

Now, in the second alternative, in step 413, photoresist 16,17 are stripped from the substrate, leaving copper traces 20,21 on the Ni—P layer 14,15, as shown in FIG. 5L. Next, in step 414, the Ni—P layer is etched away from the substrate, as shown in FIG. 5M.

Figure 5N:
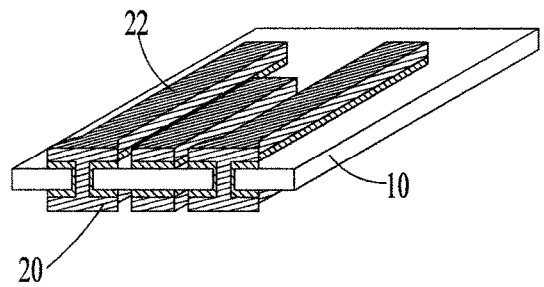

Finally, in step 415, the surfaces of the traces are finished by selective surface finishing by electroless plating of Ni/Au, electroless Nickel/Immersion gold (ENIG), Electroless Nickel/Electroless Palladium/Immersion Gold (ENEPIG), Electroless Palladium/Autocatalytic Gold (EPAG), or Immersion Gold/Electroless Palladium/Immersion Gold (IGEPIG) as shown by 22 in FIG. 5N.

The third embodiment of the present disclosure shows more than two stack-up conductive metal layers. Referring now to FIGS. 5A-5H and 7A-7N, the third preferred embodiment in the process of the present disclosure will be described in detail. The steps in the process of the third embodiment are identical to the second embodiment through step 409, copper plating, as shown in FIG. 5H.

Figure 7A:
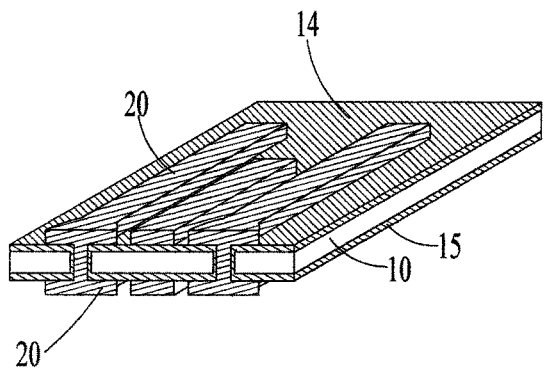
FIGS. 7A-7K schematically illustrate in oblique representation additional steps in a third preferred embodiment of the present disclosure.
Figure 7B:
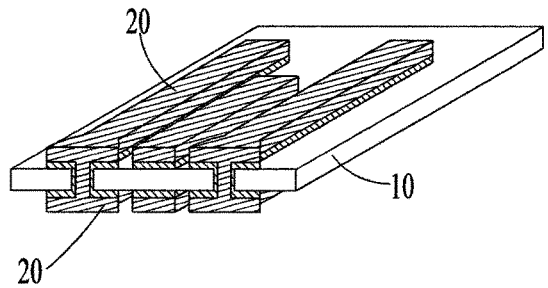

Now, as shown in FIG. 7A, photoresist layers 16,17 are stripped, followed by etching away the Ni—P seed layer 14, 15 using a hydrogen peroxide acidic base solution that is strictly controlled to etch the Ni—P seed layer in a unidirectional manner with no or minimal etch on the copper trace to maintain the copper trace aspect ratio of close to 1, as shown in FIG. 7B.

Figure 7C:
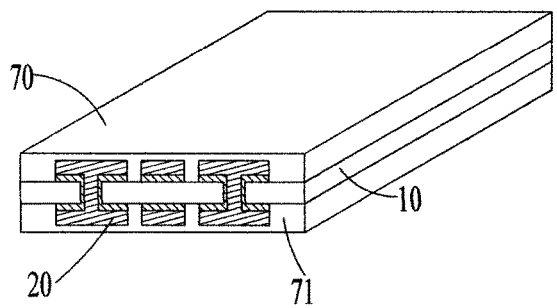

Now, as shown in FIG. 7C, a bonding film 70,71 is laminated onto the top and bottom surfaces, respectively. The bonding film can be any kind of dielectric material including polyimide, fluoropolymer, polyester, and so on. The bonding material can be any kind of modified epoxy or thermoset adhesive film reinforced with fibers, such as epoxy, cyanide ester, or acrylic adhesive. The bonding film will have a low coefficient of thermal expansion (CTE) and high glass transition temperature (Tg). Alternatively, the bonding film can be an Ajinomoto Bonding film (ABF), an epoxy resin-based film consisting of: Bisphenol A epoxy resin: 9 wt. %, Petroleum naphtha: under 5.0 wt. %, Cyclohexanone: 1.1 wt. %, N,N-dimethylformamide: 0.5 wt. %, Toluene: under 5.0 wt. %, Ethanol: under 5.0 wt. %, Methyl ethyl ketone: under 5.0 wt. %, and Silica powder: 30~40 wt. %. Alternatively, the bonding film can be Dupont FR0100 bonding film made of modified acrylic: N,N'-ethylenebis:>=10-<20%, and Antimoney trioxide:>=1-<10%.

Figure 7D:
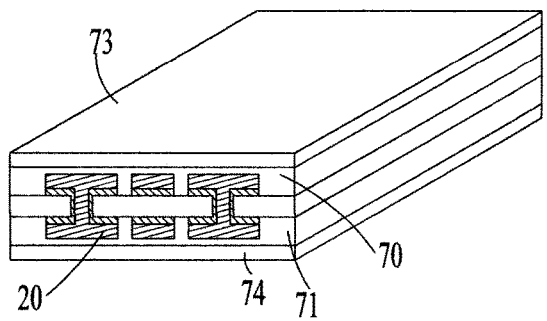

Another polyimide base film 73,74 is laminated onto the top and bottom bonding films, respectively, as shown in FIG. 7D. As an alternative to polyimide (PI), liquid crystal polymer (LCP) may be used as layer 73,74. Dielectric 73,74 has a preferred thickness of between about 12.5 and 100 µm, as shown in FIG. 7D.

Figure 7E:
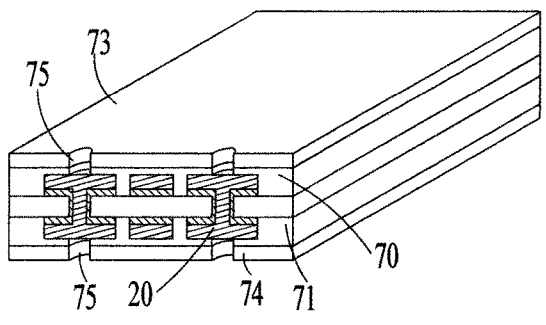

Next, via openings 75 are laser drilled through the PI layer and bonding layer on both top and bottom of the substrate 10, as shown in FIG. 7E. Vias will electrically connect the additional metal layers on either side of the substrate to the metal layers 20.

Figure 7F:
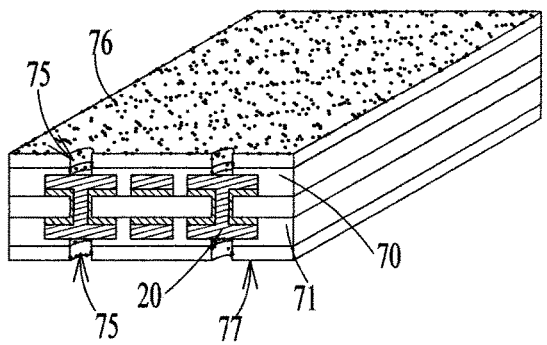

The polyimide surfaces 73, 74 are modified by applying a KOH/alkaline base chemical to the PI surface. This alters the molecular bond forming polyamic acid (PAA) anchoring layers 76, 77, as shown in FIG. 7F. Concentration of the modifier chemical is optimized to produce PAA layer thickness of less than 10 nm in order to achieve the desirable trace integrity performance.

Figure 7G:
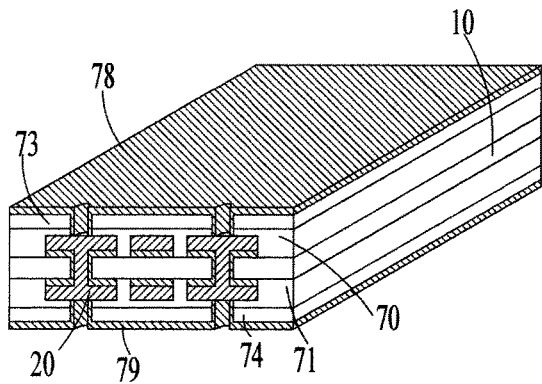

Next, a catalyst layer, not shown, is deposited on the PAA layers 76, 77 by immersion into an ionic metal solution. Typically, Palladium (Pd) or Nickel (Ni) is deposited to activate the surface for subsequent electroless Ni—P plating. In FIG. 7G, an autocatalytic nickel-phosphorus (Ni—P) seed layer 78, 79 is applied over the modified polyimide films 76, 77 on top and bottom of the substrate, respectively, using an electroless plating process. The thickness of the Ni—P layer is ideally 0.1 µm+/−10%. The composition of Ni—P in the seed layer is Ni: 96.5~97.5 wt %, P: 2.5~3.5 wt %.

Figure 7H:
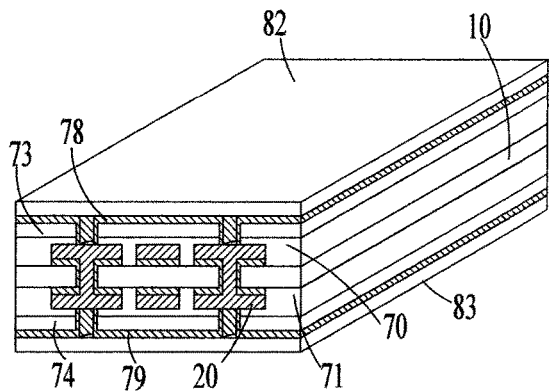
Figure 7I:
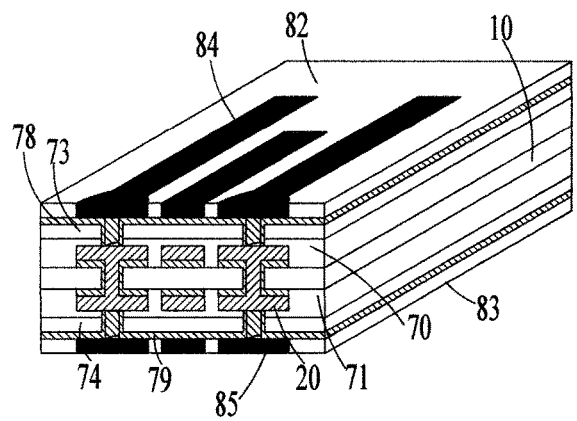
Figure 7J:
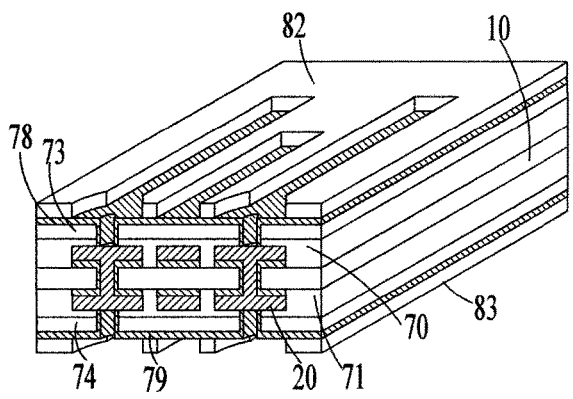

The substrate is annealed at about 200° C. for a duration of at least ten minutes and at most two hours. As shown in FIG. 7H, a layer of photoresist 82, 83, preferably a positive-acting photoresist, is applied to the seed layer surface 78, 79 on top and bottom, respectively, of the substrate. The photoresist may be a dry film or a liquid photoresist. In the photolithography process, the photoresist is exposed (FIG. 7I) and developed (FIG. 7J) to form fine pitch traces for circuitization on top and bottom surfaces of the substrate.

Figure 7K:
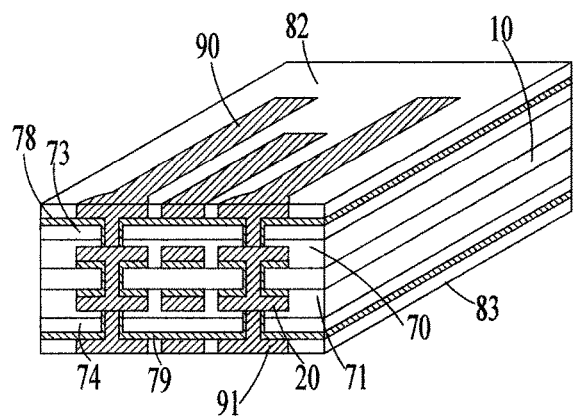

Now, in FIG. 7K, a layer of conductive metal 90, 91, including a plurality of traces for active bonding and a soldering pad, is plated up to the desired thickness on top and bottom of the substrate, respectively, using electrolytic copper plating. The plating is employed only on the areas of the spacing which are not covered by the photoresist. In some applications, the plating is controlled to be at an aspect ratio of close to 1. The ratio of the top to bottom widths of the traces using this method can be close to 1. The copper is a fine-grained deposit with highly ductile properties. The thickness of copper is about 8 µm. Copper composition details are as described above.

Figure 7L:
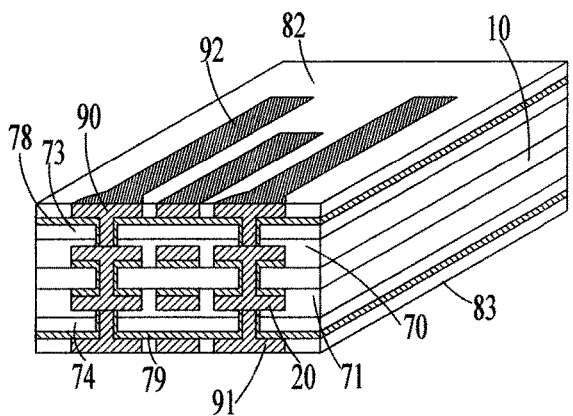
FIGS. 7L-7N schematically illustrate in oblique representation additional steps in a first alternative of the third preferred embodiment of the present disclosure.

The surfaces of the traces are finished by plating electrolytic Ni/Au, electrolytic Palladium, electrolytic Titanium, electrolytic Tin, or electrolytic Rhodium, as shown by 92 in FIG. 7L. At least one of the traces on the top and the traces on the bottom of the substrate are finished with the surface finishing 92.

Figure 7M:
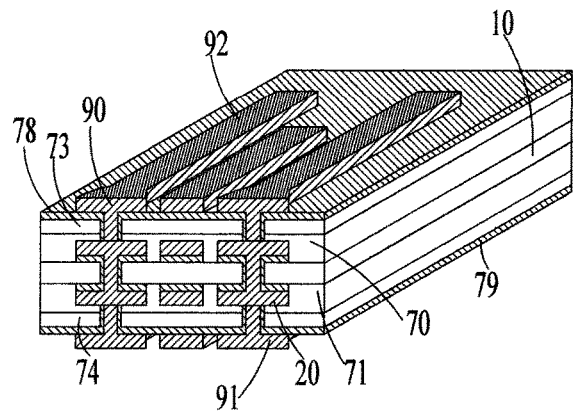
Figure 7N:
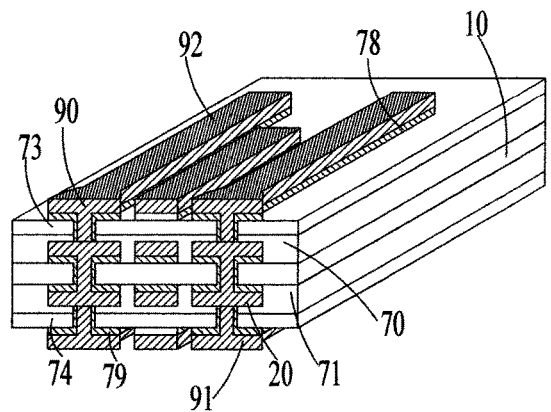

The photoresist layers 82,83 are stripped, as shown in FIG. 7M, followed by etching away the Ni—P seed layer 78, 79 using a hydrogen peroxide acidic base solution that is strictly controlled to etch the Ni—P seed layer in a unidirectional manner with no or minimal etch on the copper trace to maintain the copper trace aspect ratio of close to 1, as shown in FIG. 7N. This completes formation of four level metal traces on the flexible substrate.

A second alternative in the third embodiment of the disclosure will now be described with reference to FIGS. 5A-5H, 7A-7K, and 7O-7Q. The first alternative process included an electrolytic surface finishing. The second alternative process includes an electroless surface finishing. The steps in the process of the second alternative are identical to the first alternative through copper plating, as shown in FIG. 7K.

Figure 7O:
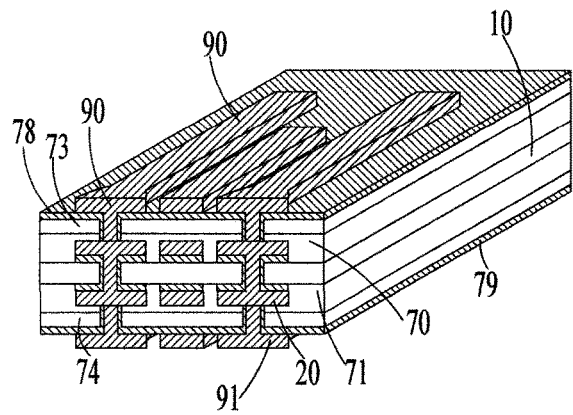
FIGS. 7O-7Q schematically illustrate in oblique representation additional steps in a second alternative of the third preferred embodiment of the present disclosure.
Figure 7P:
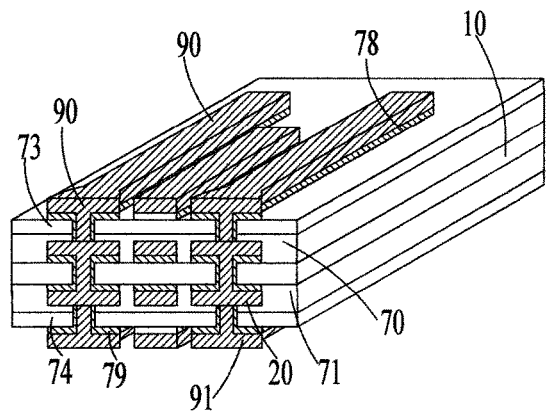

Now, in the second alternative, photoresist 78, 79 are stripped from the substrate, leaving copper traces 90, 91 on the Ni—P layer 78, 79, as shown in FIG. 7O. Next, the Ni—P layer is etched away from the substrate, as shown in FIG. 7P.

Figure 7Q:
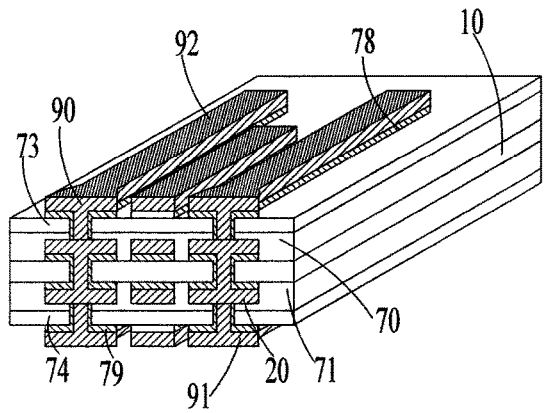

Finally, the surfaces of the traces are finished by selective surface finishing by electroless plating of Ni/Au, electroless Nickel/Immersion gold (ENIG), Electroless Nickel/Electroless Palladium/Immersion Gold (ENEPIG), Electroless Palladium/Autocatalytic Gold (EPAG), or Immersion Gold/Electroless Palladium/Immersion Gold (IGEPIG) as shown by 92 in FIG. 7Q. At least one of the traces on the top and the traces on the bottom of the substrate are finished with the surface finishing 92.

After the traces are fabricated, a cover coat, such as solder resist or coverlay, is formed to act as a barrier between adjacent copper traces to protect the traces and prevent electrical shorts. The flexible substrate of the present disclosure is suitable for any cover coat material.

Figure 8:
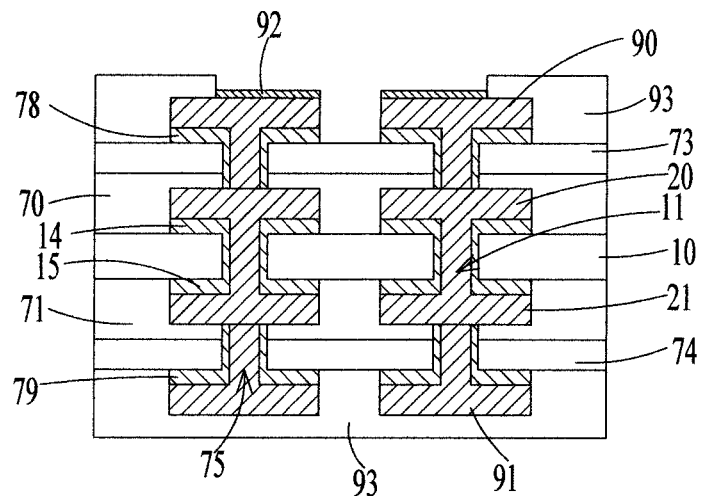
FIG. 8 is an oblique representation of a completed flexible substrate of the second preferred embodiment of the present disclosure.

FIG. 8 illustrates a completed oblique view of the four level conductive layer flexible substrate of the third embodiment. It can be seen that the metal layers 90, 20, 21, 91 (top down) are electrically connected through vias 75 and 11. Surface finishing 92 is shown on the exposed top copper traces 90. Cover coat, such as solder resist, 93 covers portions of the top copper traces 90 and covers the bottom copper traces 91. In this example, these areas are not used for bonding, so they do not need the relatively more expensive surface finishing 92.

Furthermore, a flexible substrate having multiple conductive layers more than four can be achieved by sequentially repeating the steps of the third embodiment on the completed copper formation of the third embodiment.

The process of the present disclosure can achieve an extremely smooth surface (Ra<100 nm) without compromising the trace adhesion. This smooth surface is able to minimize the conductor loss during signal transmission. The traces are compatible with various interconnection methods including thermocompression bonding, adhesive bonding, wire bonding and soldering of die or dies to form the semiconductor package.

TEM images of the substrate in the process of the present disclosure showed the thickness of the Ni—P seed layer of about 100 nm and the thickness of the PAA anchoring layer of about 3-4 nm before and after 300° C. annealing. No degradation of the PAA anchoring layer was observed after annealing.

Figure 9:
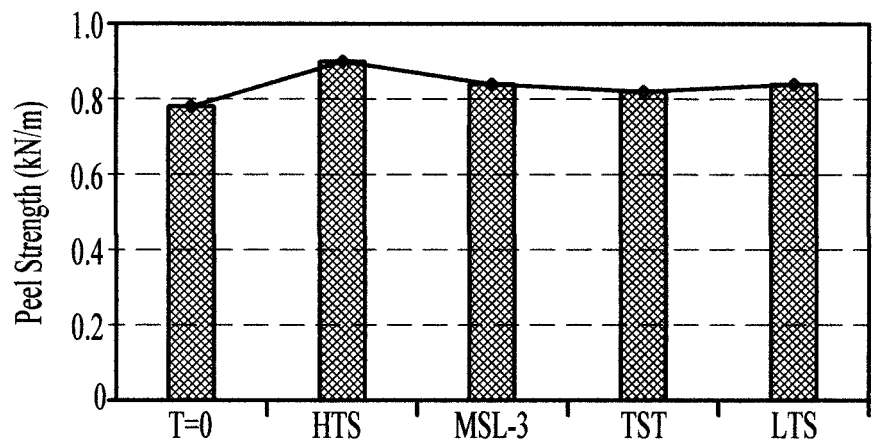
FIG. 9 graphically illustrates the peel strength of traces produced by the method of the present disclosure before and after reliability testing.

FIG. 9 graphically illustrates the peel strength of the traces produced by the method of the disclosure before (T=0) and after reliability tests. These reliability tests include HTS—high temperature storage (150° C. for 500 hr), MSL-3 (−60° C. to 60° C. for 48 hr and 3× reflow at 254° C. peak), TST—thermal shock (−40° C. to 125° C., 500 cycles, 1 h/cycle), and LTS—low temperature storage (−40° C. for 500 hr).

Figure 10:
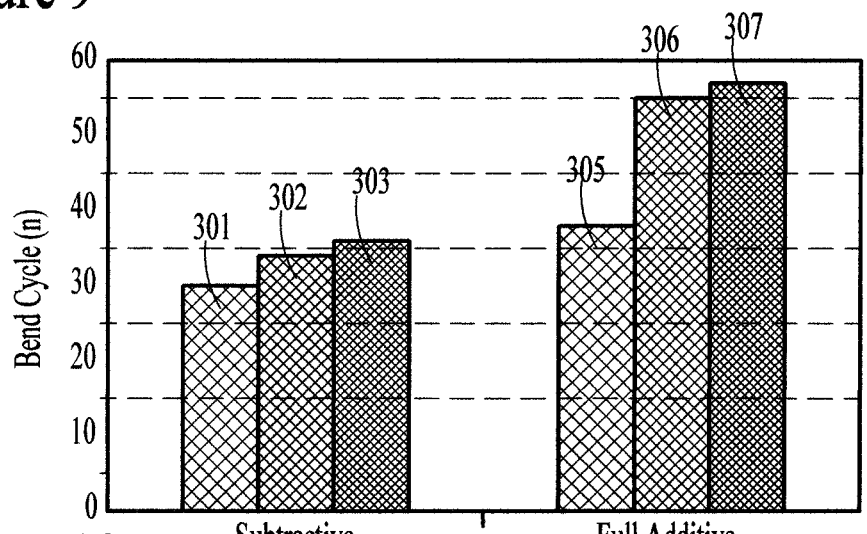
FIG. 10 graphically illustrates bending endurance before and after annealing of the flexible substrate of the present disclosure as compared to a traditional subtractive process.

FIG. 10 graphically illustrates the bending endurance before and after annealing of the flexible substrate with the proposed method (Full Additive) using direct metallization as compared to a traditional Subtractive process using a sputtering type base film material. The traditional method is shown on the left of the graph. Bending endurance is shown before annealing (301), after annealing at 200° C. for 24 hours (302), and after annealing at 300° C. for 24 hours (303). On the right is shown the bonding endurance of the full additive method of the present disclosure before annealing (305), after annealing at 200° C. for 24 hours (306), and after annealing at 300° C. for 24 hours (307). It can be seen that the process of the present disclosure provides improved bending endurance in all cases.

Figure 11:
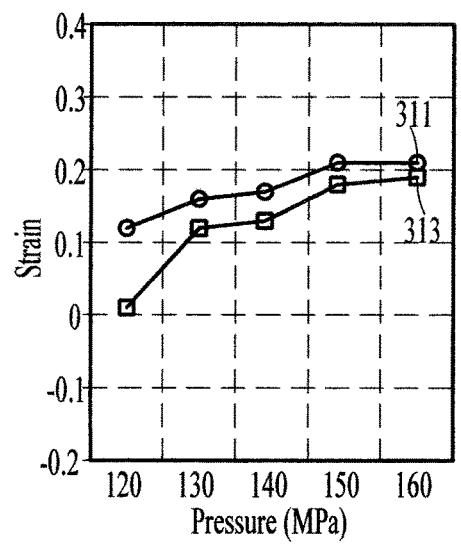
FIG. 11 graphically illustrates strain as a function of pressure of the present disclosure as compared to a traditional subtractive process.

FIG. 11 graphically shows the plastic deformation characteristic of the thermocompression bonding of the fully additive process of the present disclosure 311 as compared to a conventional subtractive (sputtering) process 313. In this graph, temperature is constant at 345° C. and the pressure is varied.

Figure 12:
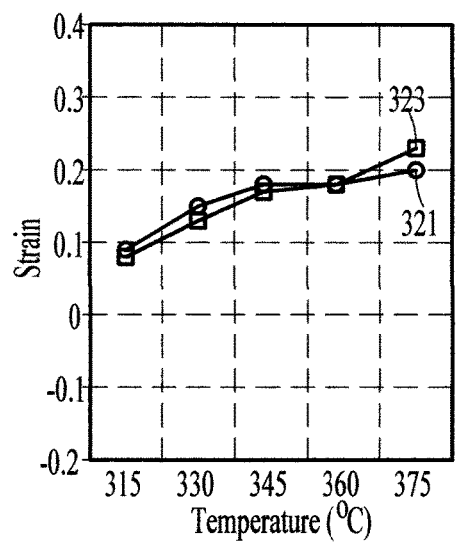
FIG. 12 graphically illustrates strain as a function of temperature of the present disclosure as compared to a traditional subtractive process.

FIG. 12 shows the deformation strain of the process of the present disclosure 321 as compared to a conventional subtractive process 323 at a constant pressure of 140 MPa at various temperatures.

Trace adhesion strength and bend durability of the process of the disclosure is similar to if not better than the substrate fabricated by a conventional subtractive process with a sputtering type base film material. Likewise, similar plastic deformation behavior after thermcompression bonding is observed as compared to a substrate fabricated by a conventional subtractive process with a sputtering type base film material. Reliable adhesion strength (on both sides for a two or more metal layer substrate) is maintained particularly due to the stability of the PAA anchoring layer after a 300° C. heat treatment for 24 hours.

The flexible substrate of the present disclosure is suitable for various interconnection methods including thermocompression bonding, wire bonding, adhesive bonding, and soldering of the IC/Chips to form a semiconductor package. The manufacturing process of the present disclosure results in an extremely smooth surface of the copper trace (Ra<100 nm) without compromising the trace adhesion. This smooth surface is able to minimize the conductor loss during signal transmission.

The present disclosure has described a method of manufacturing a flexible substrate with fine traces for COF that can be integrated into AMOLED, OLED, TFT/LCD and at least one of: a smart phone device, portable devices, IoT packaging, smart wearables, tablets, UHD TV, micro display, optoelectronics, medical devices, industrials (building & machinery monitoring), and IC packaging/3D IC integration modules.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method of manufacturing a flexible substrate comprising:
   providing a flexible dielectric substrate;
   applying an alkaline modification to said dielectric substrate to form a polyamic acid (PAA) anchoring layer on a surface of said dielectric substrate;
   electrolessly plating a Ni—P seed layer on said PAA layer;
   forming a photoresist pattern on said Ni—P seed layer;
   plating copper traces within said photoresist pattern;
   plating a surface finishing layer on said copper traces; and
   removing said photoresist pattern and etching away said Ni—P seed layer not covered by said copper traces to complete said flexible substrate.

2. The method according to claim 1 wherein said dielectric substrate comprises: any kind of polyimide (PI), including Kapton PI or Upisel PI, or liquid crystal polymer (LCP).

3. The method according to claim 1 wherein said alkaline modification comprises applying a KOH/alkaline base chemical to said dielectric substrate wherein said PAA layer has a thickness of less than 100 nm and preferably less than 10 nm.

4. The method according to claim 1 further comprising depositing a catalyst layer comprising Palladium (Pd) or Nickel (Ni) on said PAA layer by immersion into an ionic metal solution to activate said PAA layer for subsequent electroless Ni—P seed layer plating.

5. The method according to claim 1 wherein said electrolessly plating said Ni—P seed layer is an autocatalytic process and wherein said Ni—P seed layer has a thickness of 0.1 μm+/−10% and a composition of Ni: 96.5~97.5 wt % and P: 2.5~3.5 wt %.

6. The method according to claim 1 wherein said forming said photoresist pattern comprises:
   applying a photoresist on said Ni—P seed layer; and
   exposing and developing said photoresist to form a pattern for fine pitch traces for circuitization.

7. The method according to claim 1 further comprising annealing said substrate after forming said Ni—P seed layer preferably at 200° C. for at least ten minutes to at most 2 hours.

8. The method according to claim 1 wherein said plating said copper traces comprises electrolytically plating copper to a thickness of between about 2 to 18 μm wherein a ratio of the top to bottom widths of said copper traces is close to 1, wherein an elongation strength of said copper traces is over 15%, wherein a tensile strength of said copper traces is between about 290 and 340 N/mm$^2$, and wherein a hardness of said copper traces is 100 in vicker hardness with a purity of more than 99.9%.

9. The method according to claim 1 wherein said surface finishing layer comprises electrolytic Ni/Au, electroless Nickel/Immersion gold (ENIG), Electroless Nickel/Electroless Palladium/Immersion Gold (ENEPIG), electrolytic Palladium, electrolytic Titanium, electrolytic Tin, electrolytic Rhodium, Electroless Palladium/Autocatalytic Gold (EPAG), or Immersion Gold/Electroless Palladium/Immersion Gold (IGEPIG).

10. A method of manufacturing a flexible substrate comprising:
    providing a flexible dielectric substrate;
    laser drilling at least one first via opening all the way through said dielectric substrate;
    applying an alkaline modification to said dielectric substrate to form a first polyamic acid (PAA) anchoring layer on top and bottom surfaces of said dielectric substrate;
    electrolessly plating a first Ni—P seed layer on top and bottom of said first PAA layers;
    forming a first photoresist pattern on top and bottom of said first Ni—P seed layers;
    plating first copper traces within said first photoresist patterns and through said at least one first via opening;
    plating a surface finishing layer on said first copper traces; and removing said first photoresist patterns and etching away said first Ni—P seed layers not covered by said first copper traces to complete said flexible substrate.

11. The method according to claim 10 wherein said dielectric substrate comprises: any kind of polyimide (PI), such as Kapton PI or Upisel PI, and liquid crystal polymer (LCP).

12. The method according to claim 10 wherein said alkaline modification comprises applying a KOH/alkaline base chemical to said dielectric substrate wherein said first PAA layers have a thickness of less than 100 nm and preferably less than 10 nm.

13. The method according to claim 10 further comprising depositing catalyst layers comprising Palladium (Pd) or Nickel (Ni) on said top and bottom PAA layers by immersion into an ionic metal solution to activate said first PAA layers for subsequent electroless Ni—P seed layer plating.

14. The method according to claim 10 wherein said electrolessly plating said first Ni—P seed layers is an autocatalytic process and wherein said first Ni—P seed layers have a thickness of 0.1 μm+/−10% and a composition of Ni: 96.5~97.5 wt % and P: 2.5~3.5 wt %.

15. The method according to claim 10 further comprising annealing said substrate after forming said first Ni—P seed layers at 200° C. for at least 10 minutes to at most 2 hours.

16. The method according to claim 10 wherein said plating said first copper traces comprises electrolytically plating copper to a thickness of between about 2 to 18 μm wherein a ratio of the top to bottom widths of said copper traces is close to 1, wherein an elongation strength of said copper traces is over 15%, wherein a tensile strength of said copper traces is between about 290 and 340 N/mm$^2$, wherein a hardness of said copper traces is 100 in vicker hardness with a purity of more than 99.9%, and wherein a center to center distance between two adjacent said copper traces is less than 8 μm.

17. The method according to claim 10 wherein said surface finishing layer comprises electrolytic Ni/Au, electroless Nickel/Immersion gold (ENIG), Electroless Nickel/Electroless Palladium/Immersion Gold (ENEPIG), electrolytic Palladium, electrolytic Titanium, electrolytic Tin, electrolytic Rhodium, Electroless Palladium/Autocatalytic Gold (EPAG), or Immersion Gold/Electroless Palladium/Immersion Gold (IGEPIG).

18. A method of manufacturing a flexible substrate comprising:
providing a flexible dielectric substrate;
laser drilling at least one first via opening all the way through said dielectric substrate;
applying an alkaline modification to said dielectric substrate to form a first polyamic acid (PAA) anchoring layer on top and bottom surfaces of said dielectric substrate;
electrolessly plating a first Ni—P seed layer on top and bottom of said first PAA layers;
forming a first photoresist pattern on top and bottom of said first Ni—P seed layers;
plating first copper traces within said first photoresist patterns and through said at least one first via opening;
removing said first photoresist patterns and etching away said first Ni—P seed layers not covered by said first copper traces;
thereafter laminating a bonding film on top and bottom surfaces of said first copper traces;
laminating a dielectric layer on top and bottom of said bonding films;
laser drilling at least one second via opening all the way through said dielectric layer and said bonding film to contact said first copper traces on top and bottom of said substrate;
thereafter applying an alkaline modification to said dielectric layers to form a second polyamic acid (PAA) anchoring layer on top and bottom surfaces of said dielectric layers and within said at least one second via openings;
electrolessly plating a second Ni—P seed layer on top and bottom of said second PAA layers;
forming a second photoresist pattern on top and bottom of said second Ni—P seed layers;
plating second copper traces within said second photoresist patterns and through said at least one second via opening;
plating a surface finishing layer on said second copper traces; and
removing said second photoresist patterns and etching away said second Ni—P seed layers not covered by said second copper traces to complete said flexible substrate.

19. The method according to claim 18 wherein said dielectric substrate comprises: any kind of polyimide (PI), such as Kapton PI or Upisel PI, and liquid crystal polymer (LCP).

20. The method according to claim 18 wherein said alkaline modification comprises applying a KOH/alkaline base chemical to said dielectric substrate wherein said first and second PAA layers have a thickness of less than 100 nm and preferably less than 10 nm.

21. The method according to claim 18 further comprising depositing catalyst layers comprising Palladium (Pd) or Nickel (Ni) on said top and bottom PAA layers by immersion into an ionic metal solution to activate said first and second PAA layers for subsequent electroless Ni—P seed layer plating.

22. The method according to claim 18 wherein said electrolessly plating said first and second Ni—P seed layers is an autocatalytic process and wherein said first and second Ni—P seed layers have a thickness of 0.1 μm+/−10% and a composition of Ni: 96.5~97.5 wt % and P: 2.5~3.5 wt %.

23. The method according to claim 18 further comprising annealing said substrate after forming said first and second Ni—P seed layers at 200° C. for at least 10 minutes to at most 2 hours.

24. The method according to claim 18 wherein said plating said first and second copper traces comprises electrolytically plating copper to a thickness of between about 2 to 18 μm wherein a ratio of the top to bottom widths of said copper traces is close to 1, wherein an elongation strength of said copper traces is over 15%, wherein a tensile strength of said copper traces is between about 290 and 340 N/mm$^2$, wherein a hardness of said copper traces is 100 in vicker hardness with a purity of more than 99.9%, and wherein a center to center distance between two adjacent said copper traces is less than 8 μm.

25. The method according to claim 18 wherein said surface finishing layer comprises electrolytic Ni/Au, electroless Nickel/Immersion gold (ENIG), Electroless Nickel/Electroless Palladium/Immersion Gold (ENEPIG), electrolytic Palladium, electrolytic Titanium, electrolytic Tin, electrolytic Rhodium, Electroless Palladium/Autocatalytic Gold (EPAG), or Immersion Gold/Electroless Palladium/Immersion Gold (IGEPIG).

* * * * *